United States Patent [19]

Gabric et al.

[11] Patent Number: 4,599,520

[45] Date of Patent: Jul. 8, 1986

[54] BOOSTED PHASE DRIVER

[75] Inventors: John A. Gabric, Essex Junction; Edward F. O'Neil, Essex, both of Vt.

[73] Assignee: International Business Machines Corporation, Armonk, N.Y.

[21] Appl. No.: 575,612

[22] Filed: Jan. 31, 1984

[51] Int. Cl.[4] .................... H03K 5/135; H03K 5/02; H03K 17/10; H03K 17/687

[52] U.S. Cl. .................................. 307/578; 307/264; 307/269; 307/270; 307/581; 307/562

[58] Field of Search .............. 307/482, 450, 270, 269, 307/546–548, 262, 264, 562, 581

[56] References Cited

U.S. PATENT DOCUMENTS

| | | | |
|---|---|---|---|
| 3,806,738 | 4/1974 | Chin et al. | 307/228 |
| 4,091,360 | 5/1978 | Lynch | 340/166 R |
| 4,122,361 | 10/1978 | Clemen et al. | 307/482 X |
| 4,281,399 | 7/1981 | Yamumoto | 365/203 |
| 4,289,973 | 9/1981 | Eaton, Jr. | 307/578 X |
| 4,382,194 | 5/1983 | Nakano et al. | 307/578 X |
| 4,447,745 | 5/1984 | Takemae et al. | 307/578 X |
| 4,472,643 | 9/1984 | Furuyama | 307/578 X |
| 4,521,701 | 6/1985 | Reddy | 307/578 X |

OTHER PUBLICATIONS

Chan et al, "A 100 ns 5V only 64K×1 MOS Dynamic RAM", *IEEE Journal on Solid State Circuits*, vol. Sc–15, No. 5, Oct. 1980, pp. 839–846.

Chappell et al, "Decoder Circuit", *IBM Technical Disclosure Bulletin*, vol. 24, No. 5, Oct. 1981, pp. 2490–2491.

Taniguchi et al, "Fully Boosted 64K Dynamic RAM with Automatic and Self-Refresh", *IEEE Journal on Solid State Circuits*, vol. SC–16, No. 50, Oct. 1981, pp. 492–498.

Arzubi et al, "High Performance, Low Power Voltage Doubler", *IBM Technical Disclosure Bulletin*, vol. 23, No. 10, Mar. 1981, pp. 4522–4524.

*Primary Examiner*—Larry N. Anagnos
*Attorney, Agent, or Firm*—J. A. Kunkle; M. F. Chadurjian; H. J. Walter

[57] ABSTRACT

An FET double boosted clock driver for producing a clock signal having an amplitude greater than the drain supply voltage. The clock output of a second clock driver is capacitively coupled to the clock output of a first clock driver. The second clock driver boosts the voltage on the source of an enhancement mode (output) FET of the first clock driver. The output FET has its gate connected to a bootstrapped node and its drain connected to a drain voltage source (VDD). A depletion mode FET forms a feedback path between the source of the output node FET and the bootstrapped node. When the bootstrapped node is bootstrapped to VDD+VT, the output FET precharges the clock output to VDD. When the potential of the clock output approaches VDD, the depletion mode FET discharges the bootstrapped node to an input clock. Thus, the potential of the gate of the output FET is clamped to the drain supply voltage when the output is subsequently boosted by the capacitively coupled second clock driver, without adversely effecting the timing and the precharging of the enhancement mode output FET.

13 Claims, 3 Drawing Figures

BOOSTED PHASE DRIVER

DESCRIPTION

1. Technical Field

The present invention relates to bootstrapped clock driver circuits.

2. Background Art

Clock driver circuits are used to provide clock (or "phase") signals to memories such as dynamic RAMs. These phase signals are used to restore or drive the voltage on the bit/word lines of the memories to the drain supply voltage (VDD). In most dynamic RAMs, the bit/word lines are gated by enhancement mode FETs (an "enhancement mode FET" is a field effect transistor having a positive turn-on voltage VT). In order to restore the bit/word lines to VDD, the voltage of the clock signals can be "boosted" to VDD+VT in order to also turn on the gating FETs. This is particularly important in 5.0 volt VDD designs, in that the threshold voltage VT of the transfer devices represents a high percentage of both the total voltage available for data signals and the restore node voltages which can be obtained without the use of depletion devices.

In the prior art, boosted clock signals have been produced by circuits having bootstrapped devices. A "bootstrapped" device is an FET in which the source voltage rises with the applied gate voltage, which in turn rises to a level above the drain voltage. That is, the source voltage of a bootstrapped device is an integer multiple of its drain voltage VDD. An example of a boosted phase driver is shown in U.S. Pat. No. 4,281,399 entitled "Semiconductor Memory Device", issued July 28, 1981 to Yamamoto.

Boosted clock signals can also be generated by driver circuits in which the interconnected sources of a plurality of transistors are capacitively coupled to an output node. As the devices are precharged to VDD, the plate of the capacitor is also charged. Then, as the source voltages rise above the output node voltage, the charging of capacitor, increases the output node voltage. The output node will thus have a voltage which is a multiple of the drain voltage VDD. Such an output node is called a "boosted" node. Several examples of such boosted clock drivers are disclosed in Arzubi et al, "High Performance, Low Power Voltage Doubler", *IBM TDB*, Vol. 23, No. 10, March 1981, pp. 4522–4524.

Boosted clock pulses can thus be obtained through bootstrapped devices or capacitive coupling. In the present invention, a plurality of clock drivers are used to produce a double boosted clock output. As will be described in more detail later, in the invention a first clock driver produces a clock output of VDD. A second clock driver is capacitively coupled to the output of the first clock driver, such that the output of the first clock driver is boosted to an integral multiple of VDD as it approaches VDD. In order to achieve this result, the output of the first clock driver must quickly rise to VDD and thereafter remain steady prior to boosting by the capacitively-coupled second clock driver.

The concept of boosting has been used in order to produce a clock driver having an output which rises quickly to VDD. FIG. 1 is a schematic diagram of such a clock driver, which is similar to a clock driver commercially available through the MOSTEK Corp of Carrollton, Texas.

With reference to FIG. 1, when the driver is in a "standby" mode, nodes N9 and N6 are restored to the voltage VDD by devices T2 and T4, respectively. Since N6 is precharged to VDD, N12 is grounded via T7 during standby. At the same time, a first input phase signal ∅1 grounds nodes N3 and N4 through devices T11 and T12, respectively. When a second input phase signal ∅2 rises toward VDD, device T1 self-bootstraps, precharging node N4 to VDD (via bootstrapping, the voltage of the source of T1 is set equal to the voltage of the gate, which was restored to VDD by device T2). Before the phase signal ∅2 rises, both the first input phase signal ∅1 and the restore signal fall to ground. The second input phase ∅2 is received by the gate of device T5, which (upon turning on) drives node N6 to ground, turning off devices T7 and T10. After a time delay (as defined by the threshold voltage of depletion device T1) T5 turns T1 off, isolating node N6 from input phase ∅2. As the voltage on N4 rises with ∅2, device T6 will turn on, driving the voltage at N12 up to VDD and charging depletion capacitor C1 accordingly. The depletion capacitor C1 then bootstraps node N4 up to a voltage above VDD. Note that the value of this boosted voltage is a function of the capacitance on N4 in relation to the capacitance of C1. As the bootstrapping of node N4 continues, device T8 will be driven linear, precharging node N3 to VDD. Thus, upon subsequent bootstrapping of output node N3 by a capacitor C4, the node voltage will be boosted to at least VDD+VT.

As the voltage on node N3 is boosted above VDD by capacitor C4, device T8 will become reverse biased due to the bootstrapped voltage on N4. This reverse biasing causes device T8 to conduct in the reverse direction. The reverse conduction of T8 causes the source voltage (i.e., node N3) to drop to VDD. In other words, as node N3 is boosted, a bleedback current will flow in the drain of device T8, discharging node N3 to the drain voltage supply VDD. In order to eliminate this bleedback, it is necessary to clamp the voltage on N4 to VDD as the voltage on N3 rises above VDD. Others have proposed various clamping circuits (see the Arzubi article previously cited; see also U.S. Pat. No. 3,806,738, issued Apr. 23, 1974 to Chin et al and assigned to the assignee of the present application). In Chin et al the boostrap node is discharged by an enhancement device clamping circuit to one enhancement threshold voltage above ground in response to the voltage on the bootstrap node. However, since the clamping in Chin is in response to the bootstrap node voltage, as opposed to the clock output, it is possible that the node could be clamped before the clock voltage is fully precharged to VDD, thus adversely affecting precharge.

Other problems are created by the use of an enhancement device clamping circuit such as disclosed in Chin et al. Even if the parameters of the clamping circuit could be set so that the clamping action occurs at the right time, the circuit would be rendered ineffective if the system parameters change. A "system parameter change" occurs when the parameters of the manufacturing process (such as a double polysilicon process) used to produce the clock driver response change from worst to best case. The thresholds of enhancement mode devices (such as those of Chin et al) are sensitive to such parametric changes. "Worst to best case" parametric shifts can be defined as those process conditions which produce the outer physical limits of the resulting device. Further, the clamping circuit of Chin et al includes a plurality of devices and a plurality of lines connecting the circuit into the driver. This configuration has an adverse effect upon available chip space.

Thus, a need has arisen in the art for a boosted clock driver having a clamping circuit which clamps the voltage of a bootstrapped node to the drain supply voltage at the right time. Moreover, such a clamping circuit should be able to response to changes in the system parameters, and should take up a minimum of available chip space.

SUMMARY OF THE INVENTION

It is thus an object of the present invention to provide an improved clock driver.

It is another object of the invention to provide an improved double boosted clock driver.

It is yet another object of the invention to provide an improved clamping circuit for use in a boosted clock driver.

It is a further object of the invention to provide a clamping circuit which clamps the boosted voltage of a bootstrapped node to the drain supply voltage only when the clock output has been fully precharged.

It is yet another object of the invention to provide a clamping circuit which use a minimum of available chip space and does not lose its effectiveness when the system parameters vary.

These and other objects of the invention are realized by a double boosted clock driver in which the output FET of a first clock driver is clamped to VDD prior to boosting by a second clock driver capacitively coupled to the first. The output FET has its gate connected to a boostrapped node, its drain connected to a drain voltage source supplying VDD, and its source producing the clock output. A depletion mode FET has its gate connected to the clock output, its source connected to the bootstrapped node and its drain connected to an input clock signal. When the output FET is precharged to VDD by the bootstrapped node, the depletion device is driven into its linear region. The drain of the depletion FET thus clamps the voltage of the bootstrapped node to VDD prior to boosting by the capacitively-coupled second clock driver.

Another feature of the invention is the modification of the standard clock driver circuit. Zero threshold devices are utilized in order to increase the response time of the circuit. At the same time, a controllable delay stage has been added which enables the designer to precisely control the timing of the driver circuit.

BRIEF DESCRIPTION OF THE DRAWING

The foregoing features will become more apparent upon a detailed description of the best mode of carrying out the invention. In the description to follow, reference will be made to the accompanying drawings, in which.

BEST MODE FOR CARRYING OUT THE INVENTION

Figure 2:
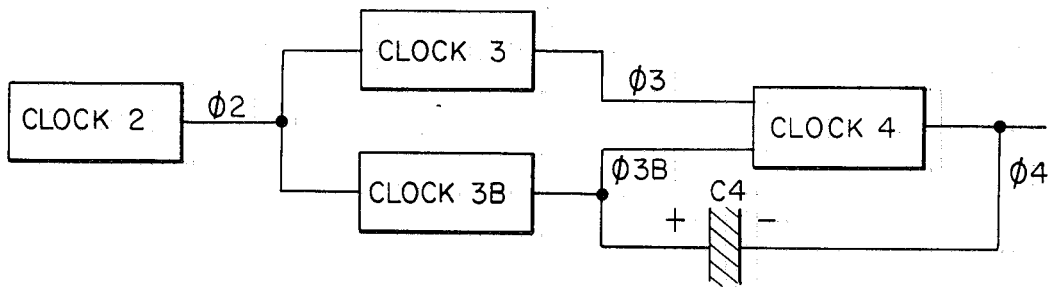
FIG. 2 is a block diagram of the double boosted clock driver circuit of the invention.

The present invention will now be described with references to FIGS. 2 and 3. FIG. 2 is a block diagram of the double boosted clock driver of the invention, in which a second clock driver is capacitively coupled to the output of a first clock driver to boost the output above VDD. In FIG. 2, an input phase signal $\emptyset 2$ from an input clock driver CLOCK 2 is fed to two clock drivers, CLOCK 3 and CLOCK 3B. A third clock driver (CLOCK 4) receives the outputs of CLOCK 3 and CLOCK 3B, respectively. The output of CLOCK 4 is connected to the output of CLOCK 3B through a depletion capacitor C4. The output phase signal $\emptyset 3B$ of CLOCK 3B is boosted above VDD to form a boosted clock signal which can be used as a clock input for dynamic RAMs having FET gating devices. It is preferred that the boosted clock signal have a maximum value between VDD+VT and (1.7)VDD, although the invention is not intended to be strictly limited to this range of values.

The operation of the double boosted clock driver of the invention will now be described. With reference to FIG. 2, the input phase signal $\emptyset 2$ actuates CLOCK 3 and CLOCK 3B. The outputs of CLOCK 3 and CLOCK 3B rise to VDD at the same rate. The output of CLOCK 3B precharges capacitor C4. As phase signal $\emptyset 3$ begins to drive toward VDD, CLOCK 4 will precharge to VDD due to a bootstrap operation. The precharging of CLOCK 4 charges the precharged depletion capacitor C4 to VDD as the output of CLOCK 3B rises to this level. As, the depletion capacitor C4 charges, it will boost the output of phase signal $\emptyset 3B$ to a voltage between VDD+VT and VDD+2VT. This voltage is dependent upon the ratios of the capacitance of the CLOCK 3B output line and capacitor C4. This boosted clock voltage can be used to drive the gate FETs of dynamic RAMs into their linear region while also driving or resetting the bit/word lines within the RAMs. It is to be understood that the invention can be used to provide boosted clock signals to any semiconductor circuit device.

In the double boosted clock driver circuit of the invention, CLOCK 2, CLOCK 3 and CLOCK 4 could be any one of a number of clock driver circuits known in the art, such as Schmitt trigger clocks or variable delay clocks. In the invention, CLOCK 3 is a variable delay clock which can be set so that its variable delay clock signal $\emptyset 3$ rise before or after signal $\emptyset 3B$ of CLOCK 3B. In this manner, the timing of the precharge of CLOCK 4 can be varied as a function of the rise time of CLOCK 3. While in the best mode CLOCK 3 is included in order to produce this variation capability, it is to be understood that the double boosted clock driver of the invention could be configured without CLOCK 3. In the latter case, CLOCK 4 would be precharged by CLOCK 3B.

CLOCK 3B of FIG. 2 must have the ability to fully rise to, and clamp at, VDD. Further, the timing involved in this rising and clamping should be precisely controlled. As discussed previously, the drivers presently available (e.g., the MOSTEK clock driver of FIG. 1) do not present these feature.

Figure 1:
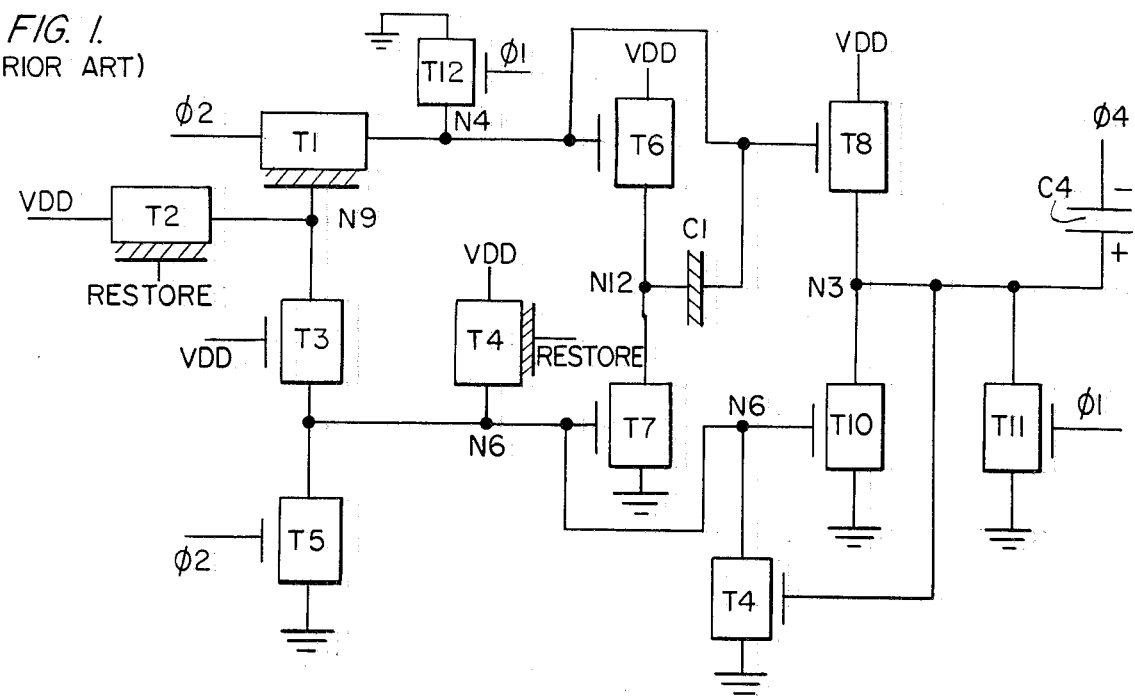
FIG. 1 (prior art) is a schematic diagram of a clock driver circuit of the prior art.
Figure 3:
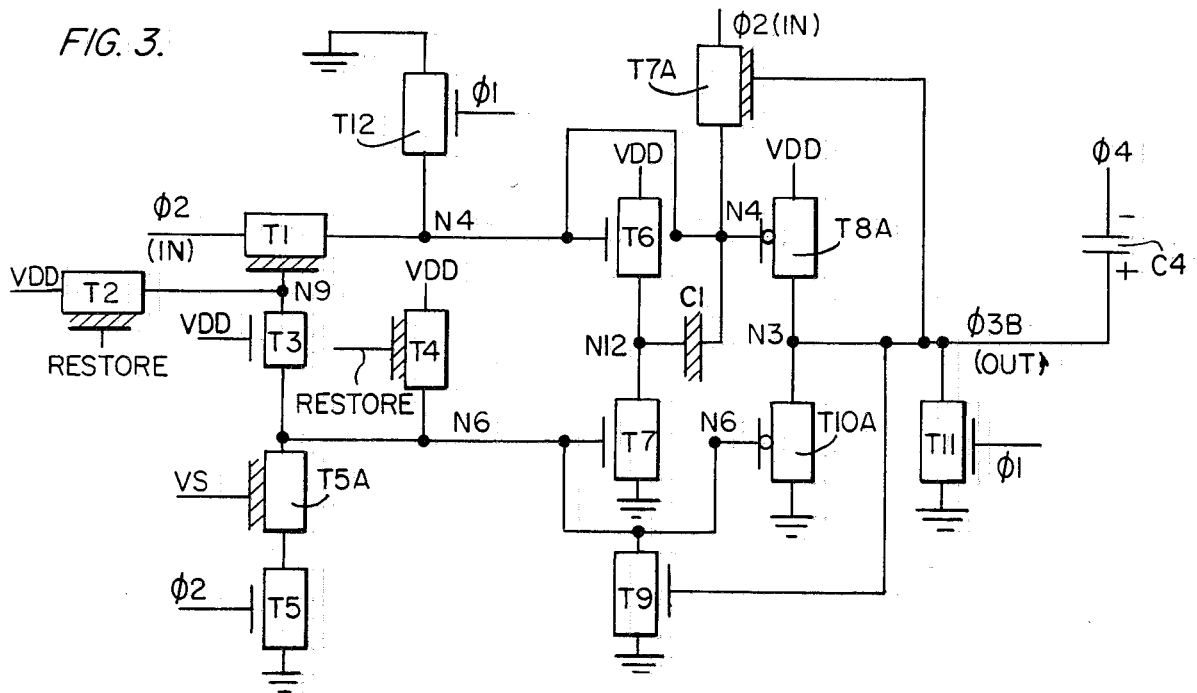
FIG. 3 is a schematic diagram of the clock driver circuit of the invention.

FIG. 3 is a schematic diagram of CLOCK 3B of FIG. 2. In order to facilitate discussion of the invention, comparisons will be made between the clock driver as shown in FIG. 1 and the clock driver of the invention as shown in FIG. 3. As is apparent upon comparison, devices T8 and T10 of FIG. 1 have been replaced by high gain zero threshold MOSFETs T8A and T10A. These zero threshold devices turn on faster with higher gain, and are incorporated in order to improve system performance. It is to be understood that the "devices"

of the invention could be any one of a number of known transistor structures (e.g., MOSFETs, JFETs, etc.).

In the invention, as depicted in FIG. 3, T5A has been added between device T5 and node N6. Device T5A is a depletion mode MOSFET which is used to impose a voltage level VS on the driver circuit. By varying voltage level VS, the designer can characterize the delay (i.e., the response time of the driver) to take into account the different response times of the other clock drivers in the double bootstrap clock driver system. Thus, T5A controls the overall response time of the driver by imposing a delay voltage VS from a variable delay setting voltage source.

In the invention, as depicted in FIG. 3, depletion mode MOSFET T7A forms a clamping feedback loop between the clock output and the bootstrapped node N4. More specifically, depletion device T7A has its drain connected to the $\emptyset 2$ input phase, its gate connected to the output clock signal, and its source connected to the bootstrapped node. Device T7A will thus clamp the voltage of the bootstrapped node to VDD as the voltage of the output clock signal rises above VDD. This prevents a bleedback current from flowing in device T8A.

The operation of the clock driver 3B of the invention will now be described. During standby, nodes N9 and N6 are restored to VDD by devices T2 and T4, respectively, which receive a "restore" pulse on their gates. Moreover, prior to turn-on (i.e., prior to receiving a second input clock pulse $\emptyset 2$) a first input clock pulse $\emptyset 1$ on the gates of devices T11 and T12 grounds nodes N3 and N4, respectively. The grounding of these nodes causes devices T6, T8A and T9 to turn off.

When a second input clock signal $\emptyset 2$ is received, T1 self-bootstraps and raises the voltage of node N4 to VDD. At the same time, T5 (which also receives the second input clock pulse $\emptyset 2$) turns on, grounding node N6 and node N9. When node N6 is grounded, devices T7 and T10A turn off. Note that after a predetermined time (as defined by its threshold), depletion device T1 turns off, isolating N4 from the second input clock pulse 2. Variable delay device T5A is turned on by device T5, which discharges the voltage of node N6 and N9 as a function of the applied voltage VS. This voltage can be varied to produce a controllable delay in the switching of devices T7 and T10A, to thus impose a controllable delay on the charging of capacitor C1. In other words, T5A controls the timing of the signal from capacitor C1 which bootstraps node N4 to a potential in excess of VT+VDD. For the purposes of further discussion, assume voltage VS is set to a value which does not affect system response.

As the voltage on N4 rises to VDD charging depletion capacitor C1, device T6 turns on. Consequently, as device T6 turns on, N12 rises to VDD thus the gate voltage of both T6 and T8A will be bootstrapped by the capacitor C1 to a potential of approximately VDD+VT. The timing of device T1 is set so that node N4 is isolated from input phase $\emptyset 2$ when this bootstrapping operation occurs. Eventually, device T8A will be driven into its linear region. Note that since device T8A is a zero threshold device, it will be driven into its linear region sooner than a typical FET. When it is driven into its linear region, device T8A will precharge node N3 to the supply voltage VDD.

When the potential of the signal on output node N3 approaches VDD, depletion device T7A will turn on. Since the threshold voltage of the depletion device (−VT) is below that of device T8A (+VT), device T7A will not conduct until its gate voltage (and hence the voltage of the output node) has reached a level approaching VDD. As T7A turns on, the excess charge on node N4 will be dissipated to the second input phase $\emptyset 2$ through the drain electrode of T7A. It is to be understood that T7A could be any transistor device having a threshold below that of device T8A. By stabilizing the voltage on the gate of device T8A at VDD, depletion device T7A prevents device T8A from becoming reverse biased when capacitor C4 subsequently boosts its source above VDD.

The feedback circuit defined by depletion device T7A thus performs the requisite function of clamping the voltage on N4 to the drain supply voltage at the right time (i.e., when the source of T8A has been fully precharged to VDD) prior to subsequent boosting of N3 by the discharge of capacitor C4 of FIG. 2. This function is achieved in this invention by a circuit which takes up a minimal amount of available chip space. Moreover, since the circuit utilizes a depletion mode device, it will not be adversely affected by changes in the system parameters caused by differences in the manufacturing process. This is due to the fact that the threshold of T7A is significantly lower than that of T8A, and is more insensitive to parametric changes.

In the invention, the use of high gain, zero threshold devices (T8A, T10A) improve driver performance by turning on faster and with higher gain than analogous devices (T8, T10) used in the prior art. Further, the addition of device T5A permits a designer to precisely control the response time of the driver of the invention.

It is to be understood that modifications can be made to the best mode as described above without departing from the spirit and scope of the invention.

We claim:

1. A boosted phase driver, comprising:
   first and second transistors having respective first and second predetermined threshold, and gate, drain, and source electrodes, said source electrode of said first transistor being connected to an output node, said drain electrode of said first transistor being connected to a source of drain voltage and said gate electrode of said first transistor being connected to a first node;
   a first charging means having a first side connected to said first node and a second side connected to the drain electrode of a third transistor for bootstrapping said first node to a potential at least substantially equal to the sum of said first predetermined threshold voltage and the voltage of said drain voltage source; and
   said third transistor having a gate electrode connected to a second node and a source electrode connected to ground, wherein said third transistor controls the voltage level to said second side of said first charging means;
   a fourth transistor having a drain electrode connected to said output node and a gate electrode connected to said second node and a source electrode connected to ground, wherein said fourth transistor controls the voltage level to said output node;
   a second charging means connected between said output node and a second clock source;
   isolation means for coupling an input signal from an input clock source to said first node and isolating said first node from said input signal when said first node is bootstrapped;

said second transistor having (1) a second predetermined threshold voltage being more negative for N-channel transistors or more positive for P-channel transistors than said first predetermined threshold voltage and (2) gate, drain, and source electrodes, said gate electrode being connected to said output node, said source electrode being connected to said bootstrapped first node, and said drain electrode being connected to said input clock source, said second transistor discharging said bootstrapped first node to a potential substantially equal to the voltage of said drain voltage source as the potential of said output node approaches the voltage of said drain voltage source;

said discharging occurring prior to the boosting of said output node by the discharge of said second charging means by said second clock source.

2. The apparatus as recited in claim 1, wherein said second transistor is a depletion mode FET.

3. The apparatus as recited in claim 2, further comprising:
delay means connected to said first charging means for controlling the timing of said bootstrapping of said first node.

4. The apparatus as recited in claim 1, wherein said first transistor comprises a high gain, zero threshold MOSFET and said second transistor comprises a depletion mode MOSFET.

5. A double boosted clock driver, comprising:
an input clock driver producing an input phase signal;
a first clock driver receiving said input phase signal and producing a first phase signal, said first clock driver comprising:
first and second transistors having respective first and second predetermined threshold voltage and gate, source, and drain electrodes, said source electrode of said first transistor being connected to an output node for producing said first phase signal, said first transistor gate electrode being connected to a bootstrapped node, and said drain electrode being connected to a drain voltage source supplying a drain voltage;
first means for connecting said bootstrapped node to receive said input phase signal;
second means connected to said first means for charging said bootstrapped node to a potential at least substantially equal to the sum of said threshold voltage of said first transistor and said drain voltage, said first means isolating said bootstrapped node from said input phase signal when said second means charges said bootstrapped node; said
second means including a charging means and a third transistor having the first side of the charging means connected to said bootstrapped node and a second side connected to the drain electrode of said third transistor;
said third transistor having a gate electrode connected to a switching voltage and a source electrode connected to ground, wherein said third transistor controls the switching of voltage to said second side of said charging means;
a fourth transistor having a drain electrode connected to said output node and a gate electrode connected to said third transistor gate electrode and a source electrode connected to ground, wherein said fourth transistor controls the voltage level to said output node;

third means for clamping said bootstrapped node to a potential substantially equal to said drain voltage as the potential of said first phase signal is boosted above said drain voltage, said third means comprising a second transistor having (1) a predetermined threshold voltage being more negative for N-channel transistors or more positive for P-channel transistors than that of said first transistor and (2) gate, source and drain electrodes, said gate electrode being connected to said output node, said source electrode being connected to said bootstrapped node, and said drain electrode connected to said input clock driver; and a second clock driver receiving said first phase signal and producing a second phase signal, said second clock driver being precharged to receive said drain voltage,
said second clock driver being capacitively coupled to said output node of said first clock driver for boosting the potential of said first phase signal to a voltage of at least substantially equal to the sum of said threshold voltage of said first transistor and said drain voltage,
wherein said third means prevents said first transistor from becoming reverse biased when said first phase signal is boosted.

6. The apparatus as recited in claim 5, wherein said third means comprises a depletion mode FET.

7. The apparatus as recited in claim 6, wherein said first clock driver further comprises delay means connected to said first means and said second means for imposing a controllable delay on said charging of said boostrapped node.

8. The apparatus as recited in claim 5, further comprising:
a variable delay clock driver receiving said input phase signal and producing a variable delay phase signal, said second clock driver being precharged to said drain voltage by said variable delay phase signal.

9. The apparatus as recited in claim 5, wherein said first clock driver further comprises:
a first node connected to the gate electrode of said third transistor;
said first transistor being forward biased by said output node voltage during said second phase signal;
a fifth transistor having gate, source and drain electrodes, said gate electrode being connected to said input clock driver and said source electrode being connected to said source of ground potential; and
a sixth transistor having gate, source and drain electrodes, said gate electrode being connected to a variable delay setting voltage source, said source electrode being connected to said drain electrode of said fifth transistor, and said drain electrode being connected to said first node,
said sixth transistor imposing a variable delay setting voltage from said variable delay setting voltage source on said second means and said fourth transistor to control the response time of said first clock driver.

10. A bootstrap driver circuit comprising:
a first MOSFET device having a predetermined threshold voltage and drain, source, and gate electrodes, said first MOSFET having its drain electrode connected to a drain voltage node, its source electrode connected to an output node, and its gate electrode connected to a bootstrap node;

isolation means for coupling an input signal to said bootstrap node and for isolating said bootstrap node from said input signal in the presence of a signal from a bootstrapping means which couples said bootstrap node to a potential in excess of the sum of the potential of said drain voltage node plus said predetermined threshold voltage of the first MOSFET device, said first MOSFET device precharging said output node to the potential of said drain voltage node when said bootstrap node receives said signal from said bootstrapping means;

boosting means connected to said output node for boosting the potential of said output node above the potential of said drain voltage node; and a second MOSFET device having (1) a predetermined threshold voltage being more negative for N-channel transistors or more positive for P-channel transistors than that of said first MOSFET device and (2) gate, source, and drain electrodes, said drain electrode being connected to said input node, said source electrode being connected to said bootstrap node, and said gate electrode being connected to said output node;

whereby said second MOSFET device prevents said first MOSFET device from becoming reverse biased when the potential of said output node is boosted above the potential of said drain voltage node by said boosting means.

11. The apparatus as recited in claim 10, wherein said second MOSFET device comprises a depletion mode MOSFET and said first MOSFET device comprises a high gain zero threshold MOSFET.

12. The apparatus as recited in claim 10, further comprising a delay means connected to said isolation means and said bootstrap means for imposing a controllable delay on said signal from said bootstrap means.

13. A boosted phase driver, comprising:

a first transistor having a gate electrode connected to a first signal source, a drain electrode connected to a source of drain voltage, and a source electrode connected to a first node;

a second transistor having a gate electrode connected to said drain voltage source, a drain electrode connected to said first node, and a source electrode connected to a second node;

a third transistor having a gate electrode connected to a delay setting voltage source, a drain electrode connected to said second node, and a source electrode connected to a third node;

a fourth transistor having a gate electrode connected to a second signal source, a source electrode connected to a source of ground potential; and a drain electrode connected to said third node;

a fifth transistor having a drain electrode connected to said second signal source, a gate electrode connected to said first node, and a drain electrode conected to a fourth node;

a sixth transistor having a source electrode connected to said source of ground potential, a gate electrode connected to a third signal source, and a drain electrode connected to said fourth node;

a seventh transistor having a gate electrode connected to said first signal source, a drain electrode connected to said drain voltage source, and a source electrode connected to said second node;

an eighth transistor having a gate electrode connected to said fourth node, a drain electrode connected to said source of drain voltage, and a source electrode connected to a fifth node;

a ninth transistor having a gate electrode connected to said second node, a source electrode connected to said source of ground potential and a drain electrode connected to said fifth node;

a capacitor having a first electrode connected to said fifth node and a second electrode connected to said fourth node;

a tenth transistor having a drain electrode connected to said source of drain voltage, a source electrode connected to an output node, and a gate electrode connected to said fourth node, said tenth transistor comprising a high gain, zero threshold FET:

an eleventh transistor having a gate electrode connected to said second node, a source electrode connected to said source of ground potential, and a drain electrode connected to said output node, said eleventh transistor comprising a high gain, zero threshold FET;

a twelfth transistor having a source electrode connected to said source of ground potential, a gate electrode connected to said third signal source, and a drain electrode connected to said output node;

a thirteenth transistor having a source electrode connected to said source of ground potential, a gate electrode connected to said output node, and a drain electrode connected to said second node; and a fourteenth transistor having a drain electrode connected to said second signal source, a gate electrode connected to said output node, and a source electrode connected to said fourth node, said fourteenth transistor comprising a depletion mode FET which discharges said fourth node to a potential substantially equal to the potential of said source of drain voltage when the potential of said output node is boosted above the potential of said source of drain voltage by a second clock driver capacitively coupled to said output node.

* * * * *